April 1, 1969 M. J. FINLAYSON 3,436,615
CONTACT METAL SYSTEM OF AN Al LAYER ADJACENT TO SEMI-CONDUCTOR AND A LAYER OF Au-Al INTERMETALLICS ADJACENT TO THE CONDUCTIVE METAL
Filed Aug. 9, 1967
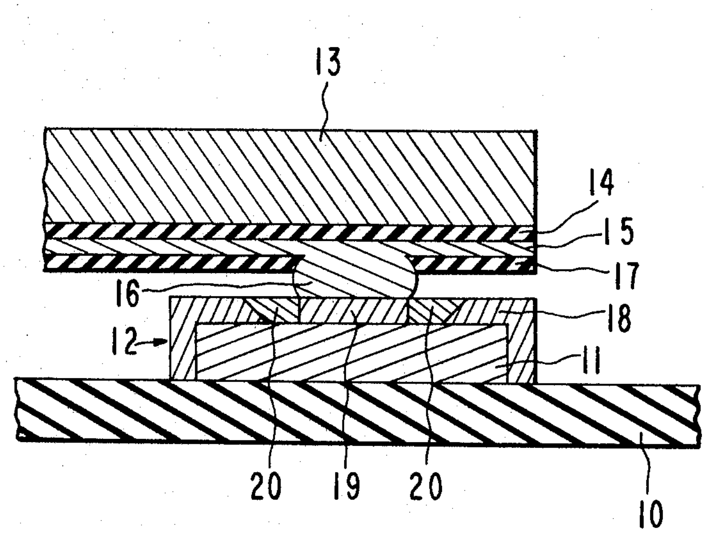
INVENTOR.
MALCOLM J. FINLAYSON
BY Roger S. Borovoy
ATTORNEY 3,436,615

CONTACT METAL SYSTEM OF AN Al LAYER ADJACENT TO SEMI-CONDUCTOR AND A LAYER OF Au-Al INTERMETALLICS ADJACENT TO THE CONDUCTIVE METAL

Malcolm J. Finlayson, Cupertino, Calif., assignor to Fairchild Camera and Instrument Corporation, Syosset, N.Y., a corporation of Delaware Filed Aug. 9, 1967, Ser. No. 659,513
Int. Cl. H01l 3/06
U.S. Cl. 317—234 5 Claims

ABSTRACT OF THE DISCLOSURE

A contact metal system for making electrical contact between a semiconductor wafer and a conductive metal bonded to a substrate. The structure includes a layer of gold aluminum intermetallics and a layer of aluminum, the aluminum layer being adjacent to the semiconductor wafer and the intermetallic layer being adjacent the conductive metal on the substrate.

One of the problems plaguing the semiconductor industry is the formation of unstable, unreliable, and undesirable intermetallics when aluminum is bonded to gold. Aluminum is used as the electrical contact material for almost all silicon semiconductor devices. Commonly gold is preferred for its highly conductive and noncorrosive properties in making printed circuit patterns on an insulating substrate, such as ceramic. However, when a bond is made between the gold and the aluminum, undesirable intermetallic compounds form. Because some of these are purple in color, the problem has been known in the art as "purple plague." It is well known that certain of these intermetallics make a very unreliable and high resistance contact and hence should be avoided at all costs. However, it has been very difficult to find a method to bond gold and aluminum but avoids their formation.

The metal system of the subject invention, rather than avoiding the formation of the undesirable purple plague, actually makes use of the intermetallic compounds in a positive manner. Using the structure of the subject invention, it has been unexpectedly discovered that a stable, reliable, and good electrical contact may be achieved using $Al_2Au$ itself (the purple-colored compound) in the electrical conductive path. Surprisingly it was discovered that a reliable contact was achieved according to the invention, as will be described below.

Briefly the metal system for making a good electrical connection between a semiconductor wafer and a conductive metal pattern on an insulating substrate of this invention comprises: a layer of electrically conductive metal securely bonded to the substrate; a layer of gold-aluminum intermetallic adjacent the conductive layer and surrounded laterally by gold, the intermetallic layer having a central portion containing $Al_2Au$ which is substantially devoid of pure gold; and a layer of aluminum making electrical contact between the central portion of the intermetallic layer and a region of the semiconductor wafer, the region of the semiconductor wafer being electrically connected to the conductive layer through the aluminum and the central portion of the intermetallic layer.

The detailed aspects of the invention will be better understood from the specific description which follows, making reference to the single figure of the drawing showing a cross section view of the metal system of the subject invention.

Deposited on insulating substrate 10 is a metallic layer 11. The substrate may be any conventional insulating material such as ceramic, epoxy, composition materials, and the like. The electrically conductive metal 11 is securely bonded to the substrate. As such, it must be a metal which adheres well both to the substrate and to the gold to be put down onto it, and it must be a reasonably good conductor. A metal or an alloy of metals chosen from molybdenum, manganese, titanium, tungsten or chromium have been found to possess the desired properties, particularly in that they adhere well to the gold and to a ceramic substrate. A preferred embodiment and specific example of the invention uses an alloy of molybdenum and manganese. If desired, the metallic layer 11 may be a multi-layer structure, such as nickel plated molybdenum-manganese.

The next layer 12 is a layer having a number of portions. The layer is deposited initially as pure gold. For example, gold may be evaporated or plated onto a substrate already having the metallized conductive pattern 11 securely bonded to it. Using electroplating, the gold will be attracted to the metal pattern 11, but will not adhere to the substrate 10. Accordingly, the metal pattern will be completely coated with gold on its top and lateral surfaces, as shown in the drawing.

Semiconductor device 13 is to be electrically connected to the conductive pattern 11. In the preferred embodiment illustrated, the device is coated with an insulating protective layer 14, normally silicon dioxide. Aluminum layer 15 has as an integral part a protruberance or bump 16. If desired, the aluminum layer 15 may be additionally protected by a coating of oxide 17, except for bump 16. This coating may be applied by a conventional deposition technique known in the art as "vapox" among others. The aluminum layer 15 normally makes ohmic electrical contact with a portion of the semiconductor body 13, although the point of the electrical contact is not shown on the drawing. Conventionally, the aluminum bump 16 is located at the periphery of the semiconductor device, for example on an integrated circuit, whereas the device regions to which the aluminum makes electrical contact are located in a more central portion of the semiconductor body 13 not shown in the drawing.

The dimensions, particularly the thicknesses, of the aluminum bump 16 and of layer 12 are important to the invention. One criterion in the selection of the thickness of the deposited gold layer is to insure that the entire gold layer is used up in the formation of the intermetallic central portion 19. If the gold is not entirely used up, a thin layer of gold will intervene between intermetallic central portion 19 and the electrically conductive layer 11. Such an intervening gold layer is undesirable in the invention and should be avoided. It must be understood that the amount of gold used up in the alloying process and the exact structure of the intermetallic layer will of course, be somewhat dependent upon the time, temperature, and pressure used in the alloying cycle, discussed below. Generally layer 12, as initially deposited is pure gold between about 25 and 300 microinches thick, preferably between about 75 and 125 microinches. The aluminum bump 16 is thicker than the gold and between 500 and 5000 microinches, preferably between 800 and 1000 microinches thick (the maximum aluminum thickness is employed if the maximum gold thickness is used).

To accomplish the bonding between the aluminum bump 16 and the electrically conductive layer 11, the device is heated to a bonding temperature between about 250° C. and 577° C. (the aluminum-silicon eutectic temperature), preferably between about 400° C. and 475° C. Pressure is applied during the bonding process, for example by applying a weight atop the silicon chip 13. The pressure is between about 2 and 50 grams per square mil, preferably between about 5 and 20 grams per square mil. The time required for bonding is at least 0.5 second, and normally less than 20 seconds, but the upper limit is not critical. Less than about 1 second undesirably reduces the stability of the resulting alloy. Using increased pressure and/or time decreases the bonding temperature required, and using increased bonding temperature decreases the pressure and/or time requirement. One skilled in the art can readily select the proper pressure, time, and temperature depending upon the ability of the die to withstand pressure and the ability of the components of the system to withstand high temperatures. Specifically, highly successful results have been obtained at a bonding temperature of about 440° C. at a pressure of 9 grams per square mil for 2 seconds.

The bonding operation results in the formation of a complex intermetallic structure. At the extreme periphery 18 of layer 12, the layer is essentially entirely gold. A central portion 19 of layer 12 contains $Al_2Au$ which is substantially free of other alloys of aluminum and gold. Central portion 19 is surrounded laterally by a ring 20 comprising aluminum-gold intermetallics, which are normally mainly other intermetallics.

One important aspect of the invention is the location of intermetallic ring 20. It is important that the electrically conductive pattern 11 form an electrical short or bridge between the pure gold portion 18 of layer 12 and the $Al_2Au$ central portion 19. It is clearly seen in the drawing that layer 11 shorts out the intermetallic ring portion 20 of layer 12 by bridging portions 18 and 19. Therefore any undesirable conductive properties of the intermetallic ring 20 are shunted to insure good electrical conductance through the gold film 12. It has been found that this film in fact carries a large part of the current through the conductive pattern.

It must be understood that the above detailed description covers only a preferred embodiment of the subject invention; modifications may be made in the structure itself and in the method of making same without departing from the spirit and scope of the invention. Therefore, the scope should be limited only as recited in the claims which follow.

What is claimed is:

1. A metal system for making a good electrical connection between a semiconductor wafer and a conductive metal pattern on an insulating substrate comprising:

a layer of electrically conductive metal securely bonded to said substrate;

a layer of gold-aluminum intermetallic adjacent said conductive layer and surrounded laterally by gold, said intermetallic layer having a central portion containing $Al_2Au$ which is substantially devoid of pure gold; and a layer of aluminum making electrical contact between said central portion of said alloy layer and a region of said semiconductor wafer, said region of said semiconductor wafer being electrically connected to said conductive layer through said aluminum and said central portion of said intermetallic layer.

2. The metal system of claim 1 further characterized by said gold-aluminum intermetallic layer being substantially entirely adjacent to said electrically conductive metal.

3. The metal system of claim 1 further characterized by said electrically conductive metal being a metal or an alloy of metals chosen from the following: molybdenum, manganese, titanium, tungsten, and chromium.

4. The metal system of claim 1 further characterized by said electrically conductive metal being an alloy of molybdenum and manganese.

5. The metal system of claim 1 further characterized by said semiconductor wafer being silicon.

References Cited

UNITED STATES PATENTS

| | | | |
|---|---|---|---|
| 3,190,954 | 6/1965 | Pomerantz | 174—94 |
| 3,271,635 | 6/1966 | Wagner | 317—234 |
| 3,290,570 | 12/1966 | Cunningham et al. | 317—240 |
| 3,202,489 | 8/1965 | Bender et al. | 29—195 |

JOHN W. HUCKERT, *Primary Examiner.*

B. ESTRIN, *Assistant Examiner.*

U.S. Cl. X.R.

317—235; 29—589